United States Patent [19]

Hata et al.

[11] Patent Number: 5,014,105
[45] Date of Patent: May 7, 1991

[54] SEMICONDUCTOR DEVICE OF COMPLEMENTARY INTEGRATED CIRCUIT

[75] Inventors: Masayuki Hata; Tsunenori Umeki, both of Hyogo, Japan

[73] Assignee: Mitsubishi Denki Kabushiki Kaisha, Tokyo, Japan

[21] Appl. No.: 529,762

[22] Filed: May 31, 1990

Related U.S. Application Data

[63] Continuation of Ser. No. 213,496, Jun. 30, 1988, abandoned.

[30] Foreign Application Priority Data

Jun. 30, 1987 [JP] Japan .................. 62-164305

[51] Int. Cl.$^5$ .................. H01L 27/02; H01L 23/48
[52] U.S. Cl. .................. 357/42; 357/68
[58] Field of Search .................. 357/42, 68

[56] References Cited

U.S. PATENT DOCUMENTS

| | | | |
|---|---|---|---|
| 4,053,916 | 10/1977 | Cricchi et al. | 357/23.7 |
| 4,672,584 | 6/1987 | Tsuji et al. | 357/42 |
| 4,689,653 | 8/1987 | Miyazaki | 357/42 |
| 4,772,930 | 9/1988 | Anami et al. | 357/42 |

FOREIGN PATENT DOCUMENTS 130557 8/1983 Japan .

OTHER PUBLICATIONS

Weste, Neil H. et al, "Principles of CMOS VLSI Design: A Systems Perspective", Addison-Wesley VLSI Systems Series, 1985, p. 89.

*Primary Examiner*—Mark Prenty
*Attorney, Agent, or Firm*—Lowe, Price, LeBlanc, Becker & Shur

[57] ABSTRACT

A complementary IC device comprises: an n-semiconductor substrate; a p-well formed within the n-substrate: a n-channel FET (field effect transistor) formed on the p-well, the n-channel FET including an n-source connected to a first grounded line and an n-drain connected to an output line; a p-channel FET formed on the n-substrate, the p-channel FET including a p-source connected to a first voltage source line and a p-drain connected to the output line; a contact p-region formed on the p-well for providing electrical connection between the p-well and a second grounded line; and a contact n-region formed on the n-substrate for providing electrical connection between the n-substrate and a second voltage source line.

17 Claims, 1 Drawing Sheet

SEMICONDUCTOR DEVICE OF COMPLEMENTARY INTEGRATED CIRCUIT

This application is a continuation of Application Ser. No. 07/213,496 filed June 30, 1988, and now abandoned.

BACKGROUND OF THE INVENTION

1. Field of the Invention

This invention relates to a semiconductor device and more particularly to a semiconductor device of a complementary IC (integrated circuit).

2. Description of the Prior Art

FIG. 1 is a schematic sectional view of a conventional semiconductor device of a complementary IC. Such a complementary IC device is shown, e.g., in page 89 of PRINCIPLES OF CMOS VLSI DESIGN edited by N. H. E. Weste and K. Eshraghian and published 1985 by Addison-Wesley Publishing Co. In FIG. 1, an n-semiconductor substrate 1 includes a p-well 2. A contact p-region 3 is formed in the surface region of the p-well 2 and connected to a grounded line 9 through a contact hole opened in an insulator layer 15. Similarly, a contact n-region 4 is formed in the surface region of the n-substrate 1 and connected to a voltage source line 10. A source 5a, a drain 5b and a gate electrode 6 constitute an n-channel MOS (metal oxide semiconductor) transistor on the p-well 2. The source 5a is connected to the grounded line 9, while the drain 5b is connected to an output line 11. Similarly, a source 7a, a drain 7b and a gate electrode 8 constitute a p-channel MOS transistor on the n-substrate 1. The source 7a is connected to the voltage source line 10, and the drain 7b is connected to the output line 11.

In the device of FIG. 1, potential of the n-substrate 1 is stabilized by means of the n-contact 4 and voltage source line 10. Similarly, potential of the n-well 2 is stabilized by means of the p-contact 3 and grounded line 9. Therefore, a parasitic p-n-p-n thyristor constituted of the p-source 7a, n-substrate 1, p-well 2 and n-source 5a is hardly activated, so that the latch-up phenomenon may be prevented. The latch-up phenomenon is described in detail, e.g., in the Japanese Patent Laying-Open Gazette No. 58-130557 (1983) or the corresponding U.S. Pat. Application Ser. No. 338778 filed 1/11/82 and now abandoned.

In the conventional complementary IC device of FIG. 1, however, if a noise potential such as a surge is accidentally introduced in the output line 11, the surge will reach the source 5a or 7a depending on the state of the corresponding MOS transistors and then spread through the grounded line 9 or voltage source line 10 into the p-well 2 or n-substrate 1. For example, when the output line 11 outputs a high level, the p-channel MOS transistor on the n-substrate is in an on-state. In this situation, the surge reaches the source 7a and enters the n-substrate 1 through the voltage source line 10 and n-contact 4. As a result, the potential of the n-substrate becomes unstable. This unstable potential may act as a trigger of activating the above described parasitic thyristor and then the latch-up phenomenon tends to be caused.

SUMMARY OF THE INVENTION

In view of the above described problem in the prior art, it is an object of the present invention to provide a semiconductor device of a complementary IC which is immune to the latch-up in spite of a noise potential such as a surge on the output line.

According to an aspect of the present invention, a semiconductor device of a complementary integrated circuit comprises an n-semiconductor substrate; a p-well formed within the n-substrate; a n-channel FET (field effect transistor) formed on the p-well, the n-channel FET including an n-source connected to a first grounded line and an n-drain connected to an output line; a p-channel FET formed on the n-substrate, the p-channel FET including a p-source connected to a first voltage source line and a p-drain connected to the output line; a contact p-region formed on the p-well for providing electrical connection between the p-well and a second grounded line; and a contact n-region formed on the n-substrate for providing electrical connection between the n-substrate and a second voltage source line.

According to another aspect of the present invention, a semiconductor device of a complementary integrated circuit comprises: a p-semiconductor substrate; an n-well formed within the p-substrate; a n-channel FET formed on the p-substrate, the n-channel FET including an n-source connected to a first grounded line and an n-drain connected to an output line; a p-channel FET formed on the n-well, the p-channel FET including a p-source connected to a first voltage source line and a p-drain connected to the output line; a contact p-region formed on the p-substrate for providing electrical connection between the p-substrate and a second grounded line; and a contact n-region formed on the n-well for providing electrical connection between the n-well and a second voltage source line.

According to a further aspect of the present invention, a semiconductor device of a complementary integrated circuit comprises: a semiconductor substrate; an n-well and a p-well formed within the substrate; an n-channel FET formed on the p-well, the n-channel FET including an n-source connected to a first grounded line and an n-drain connected to an output line; a p-channel FET formed on the n-well, the p-channel FET including a p-source connected to a first voltage source line and a p-drain connected to the output line; a contact p-region formed on the p-well for providing electrical connection between the p-well and a second grounded line; and a contact n-region formed on the n-well for providing electrical connection between the n-well and a second voltage source line.

Accordingly, even if a noise potential such as a surge is introduced in the output line, the potential of the n-substrate (or n-well) will be maintained stable by the second voltage source and also the p-well (or p-substrate) will be maintained stable by the second grounded line.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
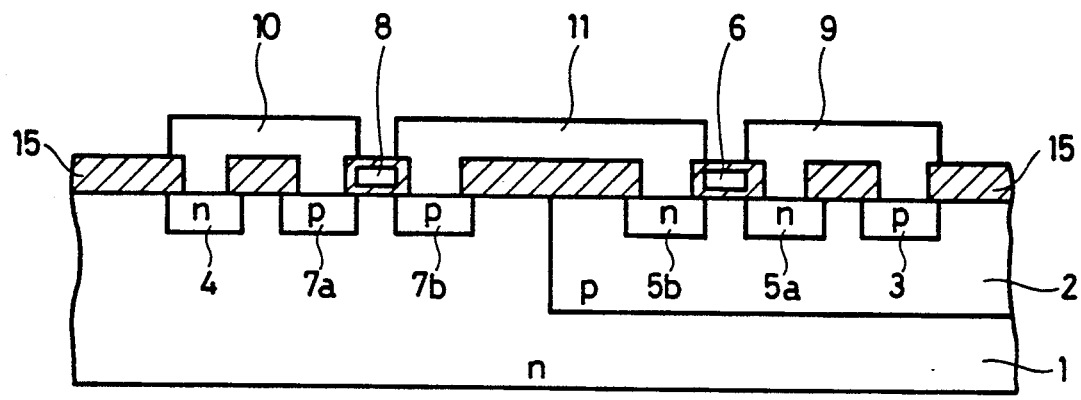
FIG. 1 is a schematic sectional view of a conventional semiconductor device of a complementary IC.
Figure 2:
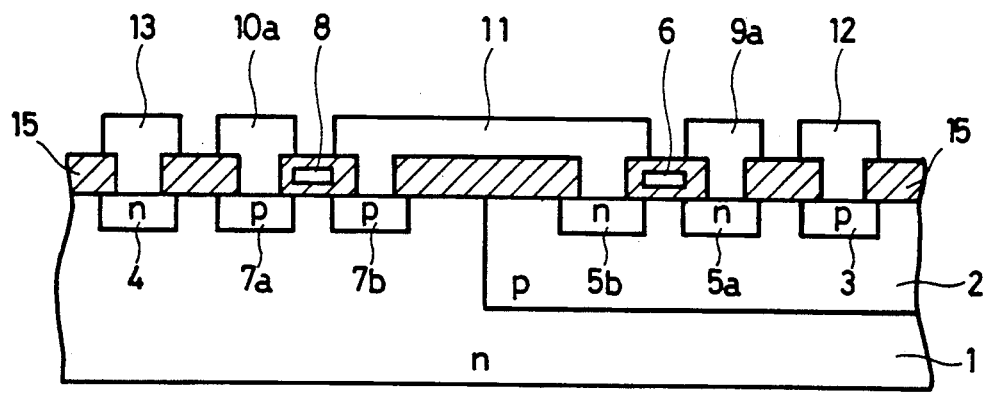
FIG. 2 is schematic sectional view of a semiconductor device of a complementary IC according to an embodiment of the present invention.

Referring to FIG. 2, there is shown a complementary IC device according to an embodiment of the present invention. It is noted that the same reference characters are used in FIG. 2 as in FIG. 1 for corresponding portions. The device of FIG. 2 is similar to that of FIG. 1, but includes first and second grounded lines 9a and 12 instead of the grounded line 9 and also includes first and second voltage source lines 10a and 13 instead of the voltage source line 10. In the device of FIG. 2, the n-source 5a connected to the first grounded line 9a, while the contact p-region is connected to the second grounded line 12. Similarly, the p-source 7a is connected to the first voltage source line 10a, while the contact n-region is connected to the second voltage source line 13.

When a noise potential such as a surge is accidentally introduced in the output line 11 of the device of FIG. 2, the surge reaches the source 5a or 7a depending on the state of the corresponding MOS transistors and then goes out along the first grounded line 9a or the first voltage source line 10a. Therefore, the surge does not reach either the contact p-region 3 or the contact n-region 4. In other words, the potential of either the n-substrate 1 or p-well 2 does not become unstable, and thus it is hardly possible that the latch-up occurs in the complementary IC device.

Although a complementary IC device comprising an n-substrate and p-well has been described in the above embodiment, it will be appreciated by one of ordinary skill in the art that the present invention is also applicable to a device comprising n- and p-wells within a n-substrate, a device comprising a p-substrate and n-well, and a device comprising an n- and p-wells within a p-substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device of a complementary integrated circuit, comprising:
   an n-semiconductor substrate;
   a p-well formed with said n-semiconductor substrate;
   an n-channel FET (field effect transistor) formed on said p-well, said n-channel FET including an n-source connected to a first grounded line and an n-drain connected to an output line;
   a p-channel FET formed on said n-semiconductor substrate,
   said p-channel FET including a p-source connected to a first voltage source line and a p-drain connected to said output line;
   a contact p-region formed on said p-well for providing electrical connection between said p-well and a second grounded line; and
   a contact n-region formed on said n-semiconductor substrate for providing electrical connection between said n-semiconductor substrate and a second voltage source line.

2. A semiconductor device of a complementary integrated circuit, comprising:
   a p-semiconductor substrate;
   an n-well formed within said p-semiconductor substrate;
   an n-channel FET formed on said p-semiconductor substrate, said n-channel FET including an n-source connected to a first grounded line and an n-drain connected to an output line;
   a p-channel FET formed on said n-well, said p-channel FET including a p-source connected to a voltage source line and a p-drain connected to said output line;
   a contact p-region formed on said p-semiconductor substrate for providing electrical connection between said p-semiconductor substrate and a second grounded line; and
   a contact n-region formed on said n-well for providing electrical connection between said n-well and a second voltage source line.

3. A semiconductor device of a complementary integrated circuit, comprising:
   an semiconductor substrate;
   an n-well and p-well formed with said semiconductor substrate;
   an n-channel FET formed on said p-well, said n-channel FET including an n-source connected to a first grounded line and an n-drain connected to an output line;
   a p-channel FET formed on said n-well, said p-channel FET including a p-source connected to a first voltage source line and a p-drain connected to said output line;
   a contact p-region formed on said p-well for providing electrical connection between said p-well and a second grounded line; and
   a contact n-region formed on said n-well for providing electrical connection between said n-well and a second voltage source line.

4. In a complementary integrated circuit having complementary first and second field effect transistors, each transistor including source and drain regions of one conductivity type and a contact region of an opposite conductivity type, said first transistor formed in a substrate and said second transistor formed in a well in said substrate, the improvement comprising:
   a structural arrangement for reducing spread of noise surges from an output line connected to said drain regions of said first and second field effect transistors to said substrate or to said well, including separate voltage source lines connected to said source and contact regions of each of the complementary first and second field effect transistors.

5. In a complementary integrated circuit including a substrate of a first conductivity type, a first field effect transistor having a conductivity of a second conductivity type opposite to said first conductivity type, said first field effect transistor having a first channel between a first source and a first drain of said second conductivity type, said first field effect transistor further including a first contact region of said first conductivity type and a first voltage level connected to said first source and to said first contact region; a well of said second conductivity type within said substrate, a second field effect transistor having a second source and a second drain of said first conductivity type formed on said well, and a second contact region of said second conductivity type formed on said well, a second voltage level connected to said second source and to said second contact region, the improvement comprising:
   a structural arrangement for reducing spread of noise surges from an output line connected to said drains of said first and second field effect transistors to said substrate or to said well, including
first and second voltage lines for providing said first voltage level to said first source and to said first contact region, respectively, and
third and fourth voltage lines for providing said second voltage level to said second source and to said second contact region, respectively.

6. An improved complementary integrated circuit as recited in claim 5 wherein said first conductivity type is an n conductivity type and said second conductivity type is a p conductivity type,
said first field effect transistor having p-type source and drain and n-type contact region,
said second field effect transistor being formed in a p-type well within an n-type substrate and including n-type source and drain and p-type contact region.

7. A semiconductor device as recited in claim 1, wherein said p-source is in an area substantially beneath a first source electrode connecting only said p-source to said first voltage source line and said n-source is in an area substantially beneath a second source electrode connecting only said n-source to said first grounded line.

8. A semiconductor device as recited in claim 7, wherein said contact n-region is in an area substantially beneath a first contact electrode connecting only said contact n-region to said second voltage source line and said contact p-region is in an area substantially beneath a second contact electrode connecting only said contact p-region to said second grounded line.

9. A semiconductor device as recited in claim 8, wherein said contact n-region is arranged substantially in a straight line orientation with respect to said p-source and said p-drain, and said contact p-region is arranged substantially in a straight line orientation with respect to said n-source and said n-drain.

10. A semiconductor device as recited in claim 2, wherein said p-source is in an area substantially beneath a first source electrode connecting only said p-source to said first voltage source line and said n-source is in an area substantially beneath a second source electrode connecting only said n-source to said first grounded line.

11. A semiconductor device as recited in claim 10, wherein said contact n-region is in an area substantially beneath a first contact electrode connecting only said contact n-region to said second voltage source line and said contact p-region is in an area substantially beneath a second contact electrode connecting only said contact p-region to said second grounded line.

12. A semiconductor device as recited in claim 11, wherein said contact n-region is arranged substantially in a straight line orientation with respect to said p-source and said p-drain, and said contact p-region is arranged substantially in a straight line orientation with respect to said n-source and said n-drain.

13. A semiconductor device as recited in claim 5, wherein said first source is in an area substantially beneath a first source electrode connecting only said first source to said first voltage line and said second source is in an area substantially beneath a second source electrode connecting only said second source to said third voltage line.

14. A semiconductor device as recited in claim 13, wherein said first contact region is in an area substantially beneath a first contact electrode connecting only said first contact region to said second voltage line and said second contact region is in an area substantially beneath a second contact electrode connecting only said second contact region to said fourth voltage line.

15. A semiconductor device as recited in claim 14, wherein said first contact region is arranged substantially in a straight line orientation with respect to said first source and said first drain, and said second contact region is arranged substantially in a straight line orientation with respect to said second source and said second drain.

16. An improved complementary integrated circuit as recited in claim 5, wherein said first field effect transistor includes a first gate defining said first channel and said second field effect transistor includes a second gate defining a second channel between said second source and said second drain,
said first contact region of said first conductivity type in said first field effect transistor including a boundary portion parallel to said first gate and
said second contact region of said second conductivity type in said second field effect transistor including a boundary portion parallel to said second gate.

17. In a complementary integrated circuit having complementary first and second field effect transistors, each transistor including source and drain regions of one conductivity type and a contact region of an opposite conductivity type, said first and second field effect transistor further including first and second gates, respectively, defining respective first and second channels between respective source and drain regions thereof, said first field effect transistor formed in a substrate and said second field effect transistor formed in a well in said substrate, the improvement comprising:
a structural arrangement for reducing spread of noise surges from an output line connected to said drain regions of said first and second field effect transistors to said substrate or to said well,
said structural arrangement including separate voltage source lines connected to said source and contact regions of each of the complementary transistors,
wherein said contact regions in said first and second field effect transistors are respectively separated from said first and second channels defined by said first and second gates,
thereby increasing a dimension of a boundary between the respective sources and channels of said first and second field effect transistors, whereby a current transfer capacity between the respective sources and channels of said transistors is increased.

* * * * *